United States Patent [19]

Tanaka et al.

[11] Patent Number: 4,815,854

[45] Date of Patent: Mar. 28, 1989

[54] METHOD OF ALIGNMENT BETWEEN MASK AND SEMICONDUCTOR WAFER

[75] Inventors: Yoshiharu Tanaka; Eiichi Kouno; Joji Iwata, all of Tokyo, Japan

[73] Assignee: NEC Corporation, Tokyo, Japan

[21] Appl. No.: 145,355

[22] Filed: Jan. 19, 1988

[30] Foreign Application Priority Data

| Jan. 19, 1987 | [JP] | Japan | 62-10281 |
| Aug. 26, 1987 | [JP] | Japan | 62-213372 |
| Aug. 26, 1987 | [JP] | Japan | 62-213375 |
| Sep. 3, 1987 | [JP] | Japan | 62-221538 |

[51] Int. Cl.$^4$ ............................................. G01B 9/02
[52] U.S. Cl. ................... 356/356; 356/363; 356/401
[58] Field of Search ............... 356/354, 355, 356, 363, 356/400, 401

[56] References Cited

U.S. PATENT DOCUMENTS

| 4,200,395 | 4/1980 | Smith et al. ................... 356/363 X |
| 4,405,238 | 9/1983 | Grobman et al. ............... 356/363 X |
| 4,704,033 | 11/1987 | Fay et al. ...................... 356/363 |

OTHER PUBLICATIONS

B. Fay et al., "Optical Alignment System for Submicron X-ray Lithography," J. Vac. Sci. Technol., 16(6), Nov./Dec. 1979, pp. 1954–1958.

Primary Examiner—Davis L. Willis
Assistant Examiner—Matthew W. Koren
Attorney, Agent, or Firm—Sughrue, Mion, Zinn, Macpeak, and Seas

[57] ABSTRACT

A method of alignment between a mask and a semiconductor wafer is disclosed. At least one linear Fresnel zone plate lens is provided on the mask, and first and second reflecting gratings are provided one the semiconductor wafer. The first reflecting grating includes a plurality of concaves or convexs arranged with a constant pitch $P_1$, and the second reflecting grating includes a plurality of concaves of convexs arranged with a constant pitch $P_2$ different from the pitch $P_1$ in the first reflecting grating. A monochromatic radiation is irradiated on the mask and first and second reflected radiations from the first and second reflecting gratings are detected by first and second detectors, respectively. A difference value between the outputs of the first and second detectors is obtained, and the relative position between the mask and the semiconductor wafer is displaced in accordance with the difference value.

11 Claims, 7 Drawing Sheets

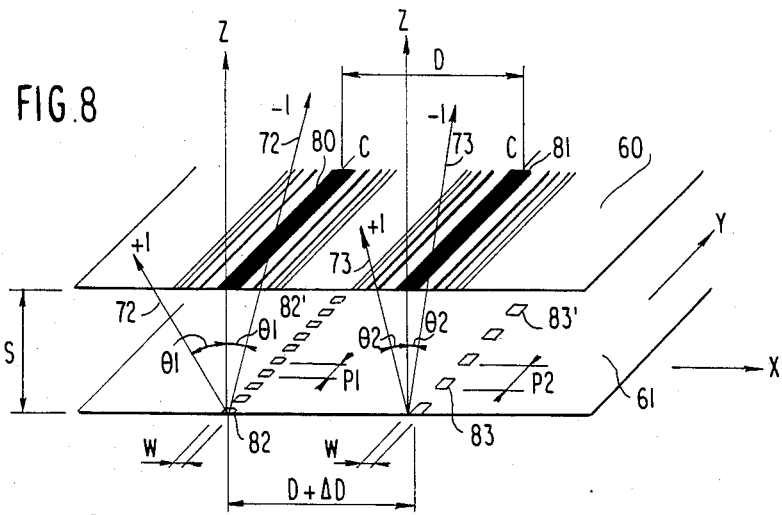
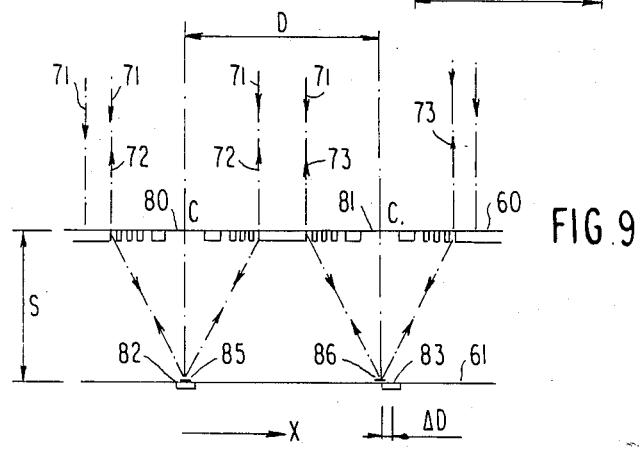
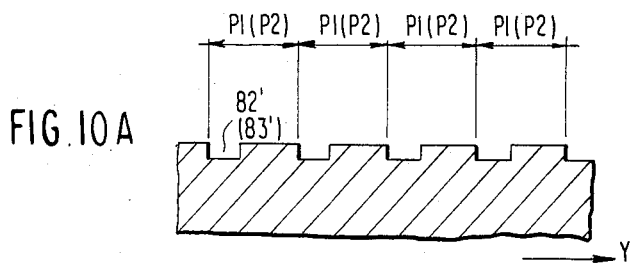
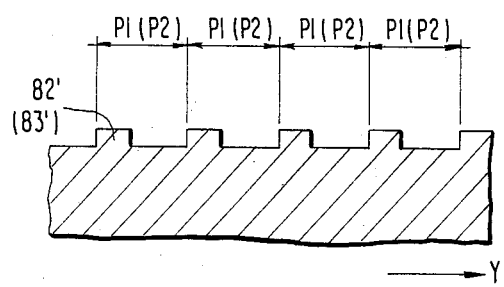

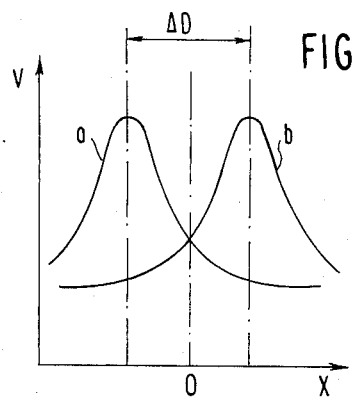
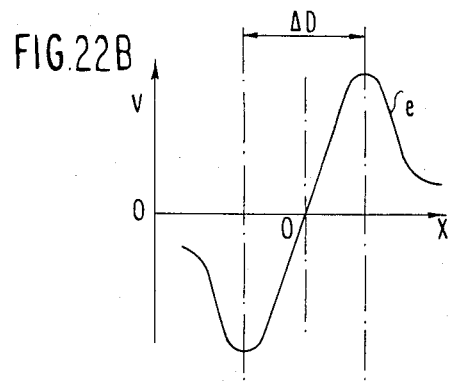
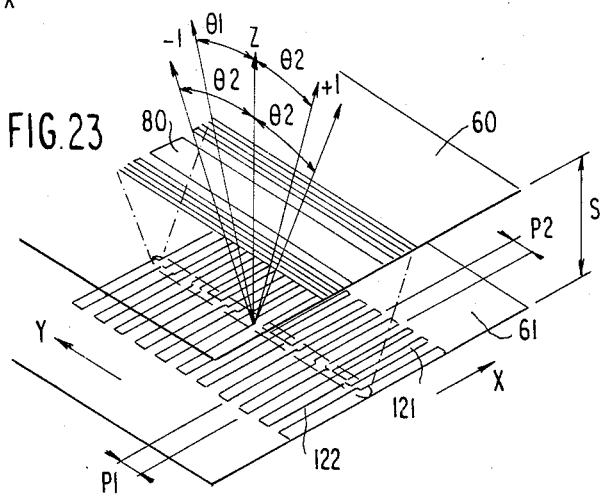
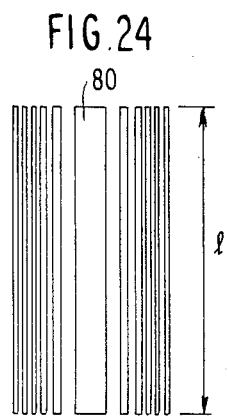
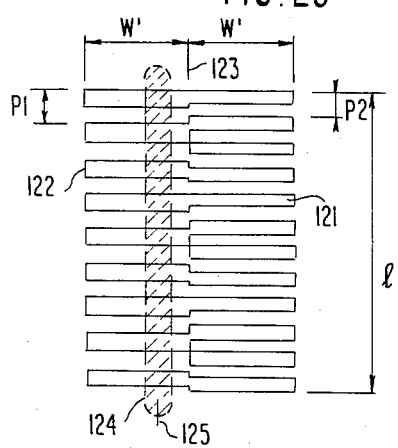
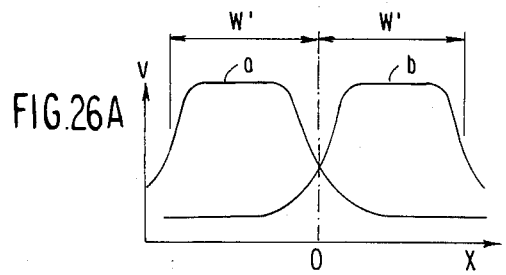
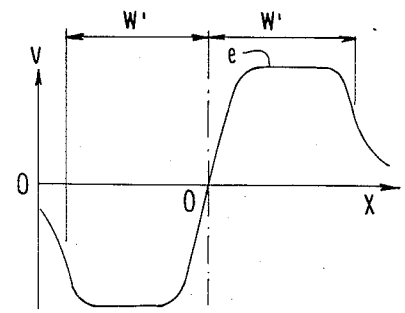

METHOD OF ALIGNMENT BETWEEN MASK AND SEMICONDUCTOR WAFER

BACKGROUND OF THE INVENTION

The present invention relates to a method of alignment between a mask and a semiconductor wafer and, more particularly to a method of alignment between a mask and a semiconductor wafer by detecting misalignment therebetween in an X-ray lithography apparatus.

To form a fine pattern on a semiconductor wafer a precise alignment between the mask and the semiconductor wafer is necessary. As a prior art, there is an optical alignment method which employs a linear Fresnel zones plate lens (hereinafter called as LFZP) proposed by Bernard Fay et al. in U.S. Pat. No. 4,311,389 and in "Journal of Vacuum Science Technology" Vol. 16(6), Nov./Dec., 1979 pp. 1954–1958 entitled "Optical alignment system for submicron X-ray lithography".

In the conventional method, a LFZP as a lens for a monochromatic radiation such as a laser beam is formed at a peripheral portion of the mask, and a reflecting grating pattern is formed at a peripheral portion of the semiconductor wafer such that it is positioned under the LFZP of the mask in the lithography process. A parallel laser beam is irradiated to the LFZP on the mask and focused on the semiconductor wafer to detect whether the reflecting grating pattern on the semiconductor wafer is positioned under the center of the LFZP or not. More particularly, the parallel laser beam in the prior art is changed in its incidence angle by a oscillating mirror to scan the focused portion on the wafer thereby examining the position of the reflecting grating pattern. When the reflecting grating pattern is not positioned under the center of the LFZP, that is, misalignment is detected, the semiconductor wafer or the mask is horizontally moved automatically so as to position the reflecting grating pattern of the semiconductor just under the center of the LFZP of the mask.

The above-described conventional method of alignment between a mask and a wafer, however, requires an optical system which includes the oscillating mirror and two lenses and therefore the prior art suffers from the disadvantages that the apparatus is complicated, it is difficult to reduce the size of the apparatus, and the cost is high. Further, since a signal from a detector and the oscillating mirror driving signal are subjected to phase detection to obtain a misalignment signal, the response time for the misalignment signal is determined by the frequency of the oscillating mirror, resulting in a disadvantageously, low response speed for detecting alignment condition.

SUMMARY OF THE INVENTION

Accordingly, an object of the present invention is to provide a method of alignment between a mask and a semiconductor wafer in which a lithography apparatus can be reduced its size and low cost by eliminating the oscillating mirror, and the alignment condition between the mask and the semiconductor wafer can be speedily detected.

According to one feature of the present invention, there is provided a method of alignment between a mask and a semiconductor wafer comprising steps of setting the semiconductor wafer on a stage, the semiconductor wafer including a first reflecting grating including a plurality of concaves or convexs arranged in a first direction with a constant pitch and a second reflecting grating including a plurality of concaves or convexs arranged in the first direction with a constant pitch which is a different value from the pitch of said first reflecting grating, the center in a second direction perpendicular to the first direction in the wafer plane of the second reflecting grating being separated from the center in the second direction of the first reflecting grating by a first distance in the second direction; superimposing the mask above the semiconductor wafer with a predetermined gap, the mask providing first and second LFZP's each including opaque and transparent stripes extending in the first direction and alternately arranged in the second direction, and the center line extending in the first direction of the LFZP being separated from the center line extending in the first direction of the second LFZP by a second distance in the second direction, the second distance being smaller or larger than the first distance by a minute value; irradiating a monochromatic radiation such as a laser beam on the first and second LFZP's and focusing the radiation to form first and second slit-shaped images of the radiation on the first and second reflecting gratings, respectively; detecting a first reflected radiation from the first reflecting grating through the first LFZP by a first detector; detecting a second reflected radiation from the second reflecting grating through the second LFZP by a second detector; obtaining a difference value between the outputs of the first and second detectors; and displacing the relative position between the mask and the semiconductor wafer in the second direction in accordance with the difference value until the difference value becomes, minimum in absolute, such as zero. The difference between the first and second distance may be substantially equal to the width in the second direction of the first and second reflecting gratings, or may ranges from 0.5 $\mu$m to 3.0 $\mu$m. The width of the slitshape image may be substantially equal to the width of the first and second reflecting gratings.

According to another feature of the present invention, there is provided a method of alignment between a mask and a semiconductor wafer comprising steps of setting the semiconductor wafer on a stage, the semiconductor wafer including a first reflecting grating including a plurality of concaves or convexs arranged in a first direction with a constant pitch and a second reflecting grating including a plurality of concaves or convexs arranged in the first direction with a constant pitch which is a different value from the pitch of the first reflecting grating; superimposing the mask above the semiconductor wafer with a predetermined gap, the mask providing a LFZP including opaque and transparent stripes extending in the first directin and alternately arranged in the second direction; irradiating a laser beam on the LFZP and focusing the laser beam to form a slit-like image of the laser beam on the first reflecting grating and/or on the second reflecting grating; detecting a first reflected radiation from the first reflecting grating through the LFZP by a first detector; detecting a second reflected radiation from the second reflecting grating through the LFZP by a firsst detector; detecting a second reflected radiation from the second reflecting grating through the LFZP by a second detector; obtaining a difference value between the outputs of the first and second detectors; and displacing the relative position between the mask and the semiconductor wafer in the second direction in accordance with the difference value until the difference value becomes minimum in absolute, such as zero. The first and second reflecting gratings may be abutted against each other in the second direction at the boundary line therebetween. In this case, each of the first and second reflecting gratings may has the width in the second direction which is substantially equal to the width of the slit-like image of said laser beam in the second direction. Or else, each of the first and second reflecting gratings may has the width in the second direction ranging from 10 μm to 30 μm. The first and second reflecting gratings may be arranged in the first direction. In this case, the center lines extending in the first direction of the first and second reflecting gratings deviate in the second direction, each other. The width in the second direction of the slit-like image of the laser beam favorably ranges from 0.5 μm to 3.0 μm.

BRIEF DESCRIPTION OF THE DRAWINGS

FIG. 8 is a prespective view showing a mask and a semiconductor wafer of a first embodiment of the present invention;

FIG. 9 is a cross-sectional view of FIG. 8;

FIGS. 10A and 10B are cross-sectional views showing reflecting gratings of the present invention;

FIG. 22A is a diagram showing output signals of detectors in the third embodiment, and FIG. 22B is a diagram showing an output signal of a subtracter in the third embodiment;

FIG. 23 is a perspective view showing a mask and a semiconductor wafer of a fourth embodiment of the present invention;

FIG. 24 is a plan view showing an LFZP of the fourth embodiment;

FIG. 25 is a plan view showing reflecting grating patterns of the fourth embodiment; and FIG. 26A is a diagram showing output signals of detectors in the fourth embodiment, and FIG. 26B is a diagram showing an output signal of a subtracter in the fourth embodiment.

DESCRIPTION OF THE PRIOR ART

Figure 1:
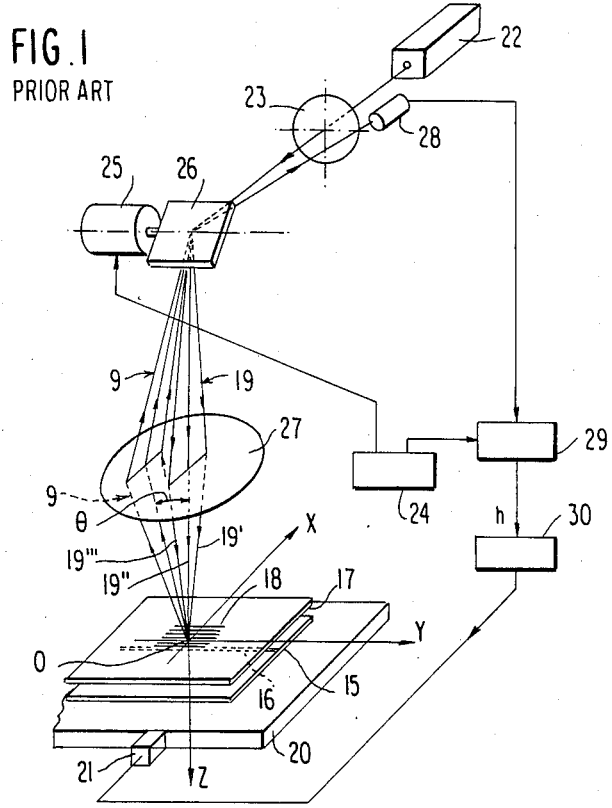
FIG. 1 is a perspective view including a block diagram showing an automatic alignment apparatus of an X-ray lithography system which employs the conventional alignment method.

Referring to FIG. 1, a reflecting diffraction grating 16 extending in Y-direction is provided on a semiconductor wafer 15, and a LFZP 18 is provided on a membrane of a mask 17 which is installed above and in parallel to the major surface of the semiconductor wafer 15 with a constant gap of several tens of um therebetween. A parallel laser beam, that is, incident laser beam 19 emitted from a laser beam source 22 is condensed by a first lens 23, reflected by an oscillating mirror 26 driven by a motor 25 exited by a generator 24, and passed through a second lens 27 irradiates the LFZP 18 on the mask 17. The irradiated position on the oscillating mirror 26 and that on the mask 17 are at the same distance from the second lens 27. The first lens 23 and the second lens 27 constitute in combination and infinite focus optical system. Accordingly, it is possible to vary the angle of incidence of the laser beam 19 to the mask by rotating the oscillating mirror 26 by the motor 25 between states 19′, 19″ and 19‴, so that the incidence beam 19 which is condensed by the LFZP 18 scans the surface of the wafer 15, that is, on the reflceting grating 16 in X-direction which is the alignment direction and perpendicular to the Y-direction in the plane. A reflected diffraction laser beam 9 from the reflecting diffraction grating 16 on the wafer 15 is spatially separated from the incident laser beam 19 at angle 0 in ZOY plane, and detected by a detector 28 through the second lens 27, the oscillating mirror 26 and the first lens 23. The output signal from the detector 28 and the signal from the generator 24 are input to a phase detector 29 to detect a phase difference between the two signals, thus obtaining a misalignment signal h. The misalignment signal h is input to a power source 30 for the piezo-electric transducer 21, so that a stage 20 installing the semiconductor wafer 15 thereon is moved in X-direction in accordance with the amount of misalignment signal h, thereby aligning the mask 17 and the semiconductor wafer 15 with each other. The alignment manner mentioned above relates only X-direction. However, the same manner is conducted in Y-direction.

Figure 2:
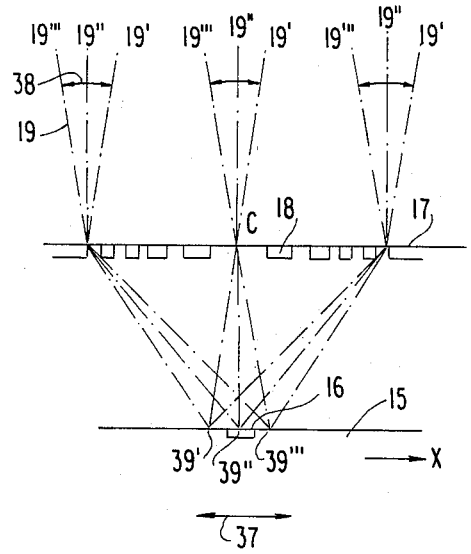
FIG. 2 is a cross-sectional view showing conditions of the incident laser beam in the conventional alignment method.
Figure 3:
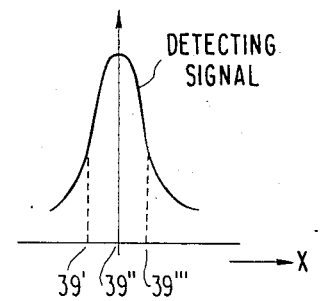
FIG. 3 is a diagram showing detected signals in the conventional method.

Referring to FIG. 2, parallel laser beam 19 which are made incident on the mask 17 from the upper side thereof are condensed by the LFZP 18 and focused on the surface of the wafer 15 to form a slit-shaped image. When the slit-shaped image thus formed and the reflecting grating 16 on the wafer surface are superposed on one straight line, the laser beam is reflected and passed through the LFZP 18 again to become parallel rays of light which are detected as an alignment signal. The parallel laser beam 19 is varied its incidence angles as shown by the arrow 38 between states 19', 19" and 19"'. Consequently, the image on the wafer is scanned as shown by an arrow 37 between positions 39', 39" and 39"', and a detecting signal curve shown in FIG. 3 is obtained. When the reflecting grating 16 is not positioned under the center of the LFZP 18, the peak of the detecting signal in FIG. 3 shifts right or left side, and the wafer is horizontally moved in X-directin automatically by the signal h mentioned above so as to position the reflecting a grating just under the center of the LFZP 18, that is, alignment is conducted.

Figure 4:
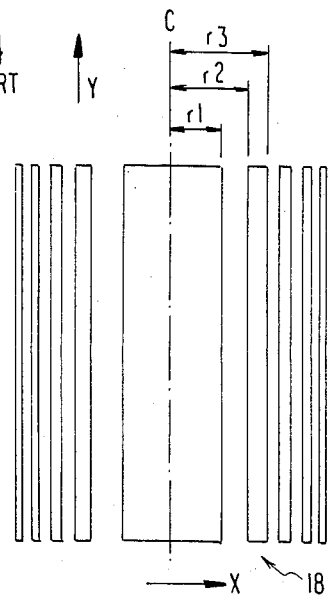
FIG. 4 is a plan view showing an LFZP on a mask.

Referring to FIG. 4, the LFZP 18 comprises a plurality of stripes extending in Y-direction and arranged to X-direction (alignment direction) perpendicular to Y-direction. Each of stripes may be made of heavy metal such as gold, silver etc. which is used to form an absorber pattern on the membrane of the mask, which absorber pattern is provided for forming a semiconductor element on the semiconductor wafer. When the heavy metal is used in the LFZP 18, the heavy metal stripes are opaque stripes, and the portions of the membrane between the heavy metal stripes become transparent stripes. More particularly, the LFZP 18 is so designed that its focal distance as the condense lens is equal to the gap between the mask and the wafer.

FIG. 4 is a plan view showing the structure of the LFZP which serves as a mark for a mask. The LFZP has a structure in which stripes having various widths are disposed parallel to each other at various spaces. Assuming that the distance from the center line C of the mark is represented by $r_n$, the stripes may be expressed by $$r_n = \sqrt{nf\lambda + n\frac{2\lambda^2}{4}},$$

where f is focal distance, and $\lambda$ is the wavelength of a laser which is employed for alignment. Although the central stripe of the LFZP shown in the figure is transparent, an arrangement which is reverse to the illustrated one may also be adopted.

The same LFZP as FIG. 4 is used in the present invention.

Figure 5:
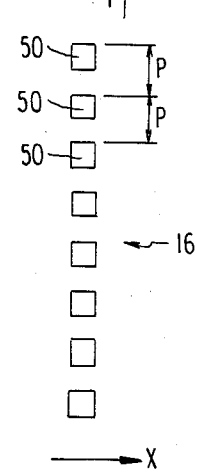
FIG. 5 is a plan view showing a reflecting grating pattern on a semiconductor wafer.

Referring to FIG. 5, the reflecting grating 16 serving as a mark for the semiconductor wafer 15 comprises a plurality of concaves or convexs 50 having rectangular plan shape and arranged in Y-direction with a constant pitch p. The concaves or convexs 50 have substantially the same plan shape and depth each other and may be formed on the major surface of the semiconductor body constituting the semiconductor substrate, that is, of a silicon body per se, or else in an insulating film provided on the major surface of the body. The separating angle $\theta$ in ZOY plane in FIG. 1 between the incidence beam 19 and the reflected beam 9 is determined by the pitch p of the reflecting grating 16 in FIG. 5. More particularly, the angle $\theta$ is determined by a formula; $\theta = \sin^{-1}(n\lambda/p)$, where $n = \pm 1, \pm 2 \ldots$; p is the pitch of the reflecting grating pattern; and $\lambda$ is the wavelength of the laser beam.

DESCRIPTION OF THE EMBODIMENTS

Figure 6:
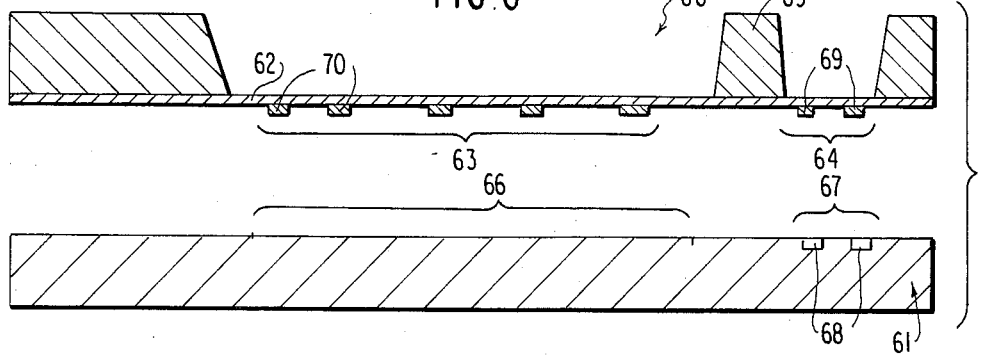
FIG. 6 is a cross-sectional view showing a mask and a semiconductor wafer in the present invention.

Referring to FIG. 6, a mask 60 and a semiconductor wafer 61 used in a method of embodiments of the present invention are described. The mask 60 comprises a support member 65 made of silicon, a membrane 62 made of silicon oxide film, silicon nitride film etc., for transmitting an X-ray and fixed on the surface of support member 65, an X-ray absorbing pattern 70 made of gold, silver, aluminum etc. formed on a center portin 63 of the membrane 62, and one or two LFZP 69 formed on a peripheral portion 64 of the membrane 62. The LFZP 69 includes a plurality of stripes made of the same material as the X-ray absorbing pattern 70 for forming a semiconductor element in the semiconductor wafer 65. The semiconductor wafer 65 is installed in parallel with the mask, that is, with the membrane 62 with a predetermined gap, and has a device forming area 66 at the center thereof or at a chip in the wafer which faces to the center portion 63 of the mask 60 and a mark forming area 67 at the peripheral thereof or at the peripheral of the chip which faces to the peripheral portin 64 of the mask 60. In the mark forming area 67, reflecting diffraction gratings 68 are provided. Each of the reflecting gratings includes a plurality of concaves or convexs which are arranged in one direction in the plan view with a constant pitch and have substantially the same rectangular or square plan shape and depth as each other. However, the pitch in one reflecting grating pattern is different from the pitch of the other reflecting grating pattern. The concaves or convexs of the reflecting grating pattern may be formed in the mojor surface of the semiconductor body constituting the semiconductor wafer, that is, of a silicon body per se, or else in an insulating film provided on the major surface of the semiconductor body.

Hereinafter, only the peripheral portion of the mask in which the LFZP is provided and the mark forming area of the wafer in which the reflecting gratings are provided are shown.

Figure 7:
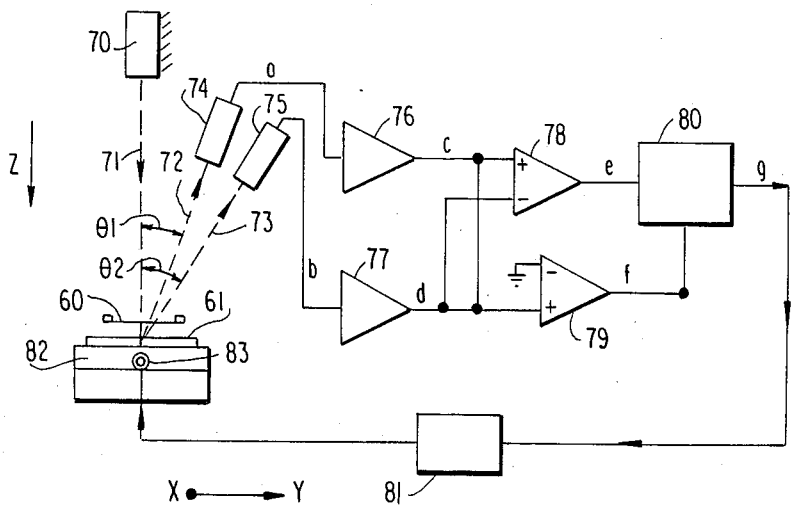
FIG. 7 a block diagram including partically a cross-sectional view showing an automatic alignment apparatus of an X-ray lithography system which conducts a method of the present invention.
Figure 12A:
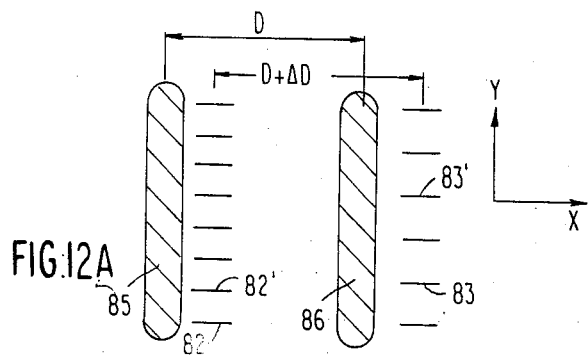
FIGS. 12A–12E are views showing the principle of the first embodiment.

Referring to FIG. 7, the semiconductor wafer 61 is installed on an X-Y stage 82 and the mask 60 is superimposed on the wafer 61 in parallel with a predetermined gap. At least one LFZP is provided in the mask 60, and first and second reflecting diffraction gratings having the same construction as FIG. 5 are provided in the wafer 60. Both of the reflecting gratings extend in the same direction (Y-direction) perpendicular to the alignment direction (X-direction). However, they have different pitch P each other. From a fixed laser beam source 70 a parallel incidence laser beam 71 of 1 mm diameter is irradiated along a fixed passage on the LFZP of the mask 60, and condensed by the LFZP and focused on the surface of the wafer 61 to form a slit-shaped image. When two LFZP are provided, two slit-shaped images are formed, and when one LFZP is provided one slit-shaped image is formed. In any case, the incident beam image or images are reflected by the first and second reflecting gratings of the semiconductor wafer 61. The reflected diffraction laser beams pass the LFZP and form parallel reflected diffraction laser beams 72 and 73. The first reflected diffraction beam 72 is obtained by the first reflecting diffraction grating and the second reflected diffraction beam 73 is obtained by the second reflecting diffraction grating. It is to be noted, the first and second reflecting gratings have the different pitch p, and therefore the first and second reflected beam 72 and 73 have the different angles $\theta_1$ and $\theta_2$ from the incident beam 71. Consequently, they can be separately detected by first and second detectors 74 and 75, respectively. A signal a from the first detector 74 is input to a first amplifier 76 which amplifies the output a of the first detector 74 to generate a first sense signal c, and a signal b from the second detector 75 is input to a second amplifier 77 which amplifies the output b of the second detector 75 to generate a second sense signal d. A subtracter 78 which subtracts the first sense signal c from the second sense signal d to generate a signal (misalignment signal) e, and an adder 79 which adds the first sense signal c and the second sense signal d to generate a reference signal f. A divider 80 which divides the misalignment signal e by the reference signal f to generate a normalized misalignment signal g. The signal g is sent to a power source 81 for a piezoelectric transducer 83, so that the X-Y stage 82 installing the semiconductor wafer 61 thereon is moved by the piezoelectric transducer 83 in X-direction (dirction normal to the surface of the sheet of FIG. 7) in accordance with the amount of misalignment signal e. The output levels a, b of the first and second detectors 74, 75 would be changed by the gap between the mask and the semiconductor wafer or a nature of a photoresist film on the semiconductor wafer. However, the sensitivity for the misalignment is not changed because the signal e is normalized by the signal f in the divider 80. Accordingly, if a servosystem is arranged using the normalized misalignment signal g obtained by this signal processing syste, there is no change in the servo gain even if the signal intensity fluctuates due to an undesirable change in the gap or the effect of the resist or the like. Thus, it is possible to realize a stable servo. Although in this embodiment two independent detectors are employed as a detector, employment of a detector consisting of two split detecting portions is better since the characteristics of the two detectors are uniform.

Instead of employing two lenses 23, 27 and an oscillating mirror 26 in FIG. 1 to effect scanning with a laser beam to thereby obtain a misalignment signal, the method of detecting misalignment between a mask and a wafer according to the present invention employs two reflecting diffraction gratings disposed adjacent to each other to obtain a misalignment signal on the basis of the difference between the signals respectivley delivered from the diffraction gratings, thereby eliminating the need for an optical system including two lenses and an oscillating mirror. Thus, the apparatus is simplified and the cost is lowered, advantageously. Further, the first and second reflected diffraction laser beam 72, 73 (FIG. 7) can be simultaneously obtained by one shot of the incident laser beam 71 having about 1 mm diameter which is sufficiently larger area than the LFZP setting portion and reflecting gratings setting portion. Therefore, the alignment condition between the mask and the semiconductor wafer can be speedily detected.

FIRST EMBODIMENT

Referring to FIGS. 8 to 10, the mask 60 is superimposed on the semiconductor wafer 61 with a predetermined gap s of 40 μm therebetween. In the mask 60, first and second LFZP's 80 and 81 having the same construction as the LFZP 18 in FIG. 4 are provided in parallel with each other. More particularly, each of the first and second LFZP's has the focal distance of 40 μm which is equal to the gap s, and be separated by a distance D of 70 μm, each other, that is, the center line c of the first LFZP 80 extends in Y-direeetion, and the center line c of the second LFZP 81 extends in Y-direction and separated from the center line of the first LFZP 80 at the distandce D of 70 μm in x-direction.

Each of LFZP's has the stripe number of twenty one and width of 40 to 50 μm, for example.

The output signal waves of the first and second detectors must by equal each other. Therefore, the first LFZP must have the same construction in stripe number, stripe shape, etc. as the second LFZP thereby obtaining the same signal strength and the same focus distance between the first and second LFZP's. In the semiconductor wafer 61, a first reflecting diffraction grating pattern 82 including a plurality of concaves (FIG. 10A) or convexs (FIG. 10B) 82' arranged in Y-direction with a constant pitch $p_1$ of 3 μm and having the width w of 2 μm in X-direction, and second reflecting diffraction grating pattern 83 including a plurality of concaves (FIG. 10A) or convexs (FIG. 10B) 83' arranged in Y-direction, with a constant pitch $p_2$ of 4 μm and the width of 2 μm in X-direction are provided. For obtaining the same detecting sensitivity of first and second reflecting gratings, the width w must be equal each other. Favorably, the width w and ΔD range from 0.5 μm to 3 μm. Each of the reflecting gratings has the length of about 500 μm in Y-direction. The distance D+ΔD between the center of the first reflecting grating 82 and the center of the second reflecting grating 83 is 72 μm, that is, ΔD is 2 μm. Favorably, the ΔD is equal to the width w of the reflecting grating. A He-Ne laser beam, that is, an incident laser beam 71 of 1 mm diameter is irradiated downward along a fixed passage to the surfaces of the mask and the wafer. A first slit-shaped image 85 elongated in Y-direction by the first LFZP 80 is formed on the first reflecting grating 82 and a second slit-shaped image 86 elongated in Y-direction by the second LFZP 81 is formed on the second reflecting grating 83. Favorably, the width of the slit shaped beam 85, 86 is substantially equal to the width of the reflecting grating. A parallel reflected diffraction laser beam 72 from the first reflecting grating pattern 82 through the first LFZP 80 is inclined from the incident laser beam 71 by an angle $\Lambda_1$ in ZOY plane, also a parallel reflected diffraction laser beam 73 from the second reflecting grating pattern 83 through the second LFZP 81 is inclined from the incident laser beam 71 by an angle $\theta_2$ in ZOY plane. In both reflected beams, component +1 may be used in the detection. The angle θ ($\theta_1$, $\theta$hd 2) of the reflected laser beam is determined by a formula; $\Theta = \sin^{-1}(n\lambda p)$, (n = ±1, ±2 ... ) as mentioned before, where p is the pitch of the reflecting grating pattern on the wafer, and λ is the wavelength of the laser beam. Since the pitch $p_1$ of the first reflecting grating pattern and the pitch $p_2$ of the second reflecting grating pattern are different, the respective angles $\theta_1$ and $\theta_2$ are also different from each other. Accordingly, the two reflected diffraction laser beam can be separatedly detected.

Figure 11A:
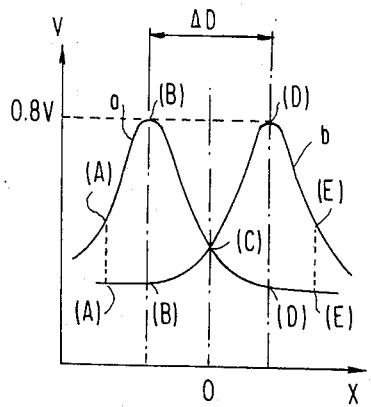
FIG. 11A is a diagram showing output signals of detectors in the first embodiment.
Figure 12B:
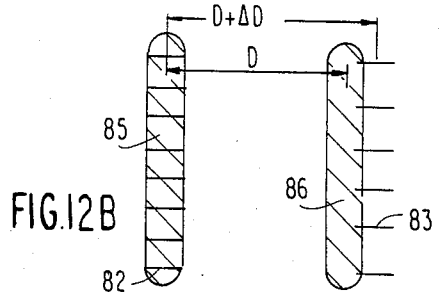
Figure 12C:
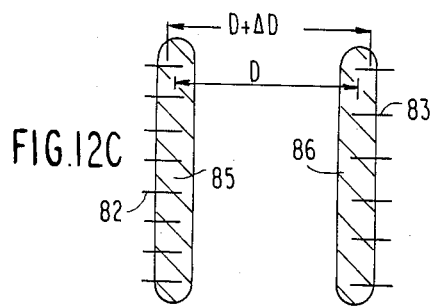
Figure 12D:
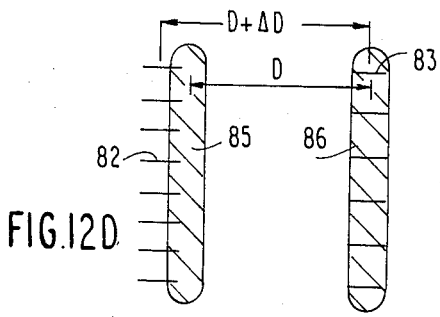

FIG. 11A shows the relationship between the misalignment and the outputs a, b of the detectors 74, 75 in FIG. 7. The curve a represents the output of the first detector 74, that is, the strength of the first reflected beam 72 from the first reflecting grating 82, and the curve b represents the output of the second detector 75, that is, the strength of the second reflected beam 73 from the second reflected grating 83. Each of the curves a, b has 0.8 V peak, for example. FIG. 10B shows the misalignment and the output e of the subtracter 78, which e can be obtained by subtracting the first detecting signal a (or the first sense signal c after the first amplifier 76) from the second detecting signal b (or the second sense signal d after the second amplifier 77). The output e is used to conduct the alignment by moving the X-Y stage as mentioned before. To avoid an interference between higher mode diffraction beams from first and second reflecting gratings, one pitch is not an integral multiple of the other pitch.

Figure 11B:
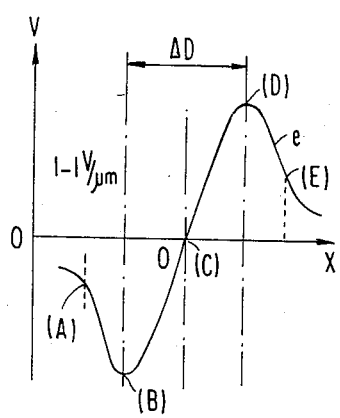
FIG. 11B is a diagram showing an output signal of a subtracter in the first embodiment.
Figure 12E:
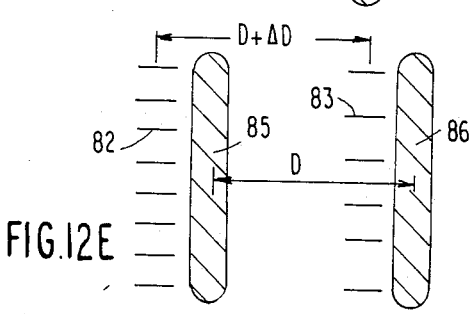
Figure 13:
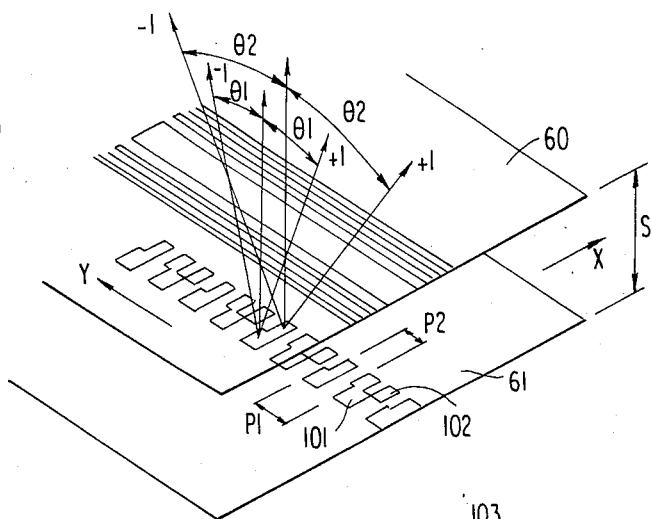
FIG. 13 is a perspective view showing a mask and a semiconductor wafer of a second embodiment of the present invention.
Figure 14:
FIG. 14 is a plan view showing an LFZP of the second embodiment.
Figure 15:
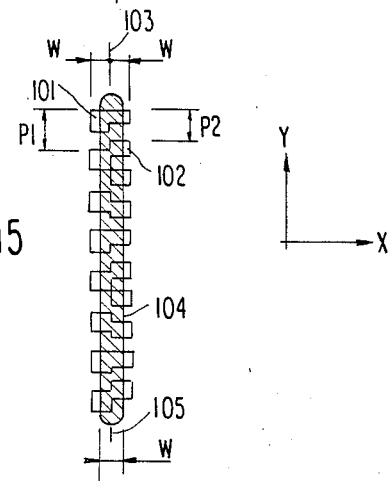
FIG. 15 is a plan view showing reflecting grating patterns of the second embodiment.
Figure 16A:
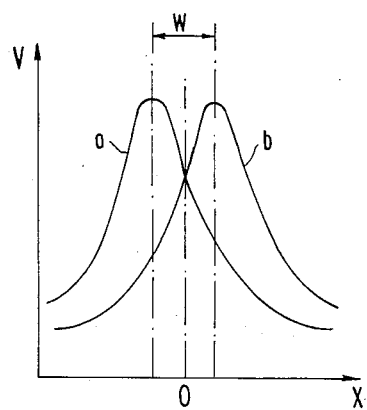
FIG. 16A is a diagram showing output signals of detectors in the second embodiment.
Figure 16B:
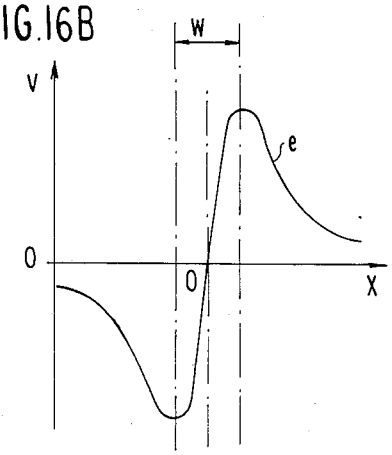
FIG. 16B is a diagram showing an output signal of a subtracter in the second embodiment.

Referring to FIG. 12, five cases of relative positions between the mask and wafer are exemplified, and signal levels of the respective cases are represented by (A) to (E) in FIGS. 11A and 11B.

In case (A), first and second slit-like images 85 and 86 by the first and second LFZP's 80 and 81 of the mask 60 are formed at left side of the first and second reflecting gratings 82 and 83 of the wafer 61. Signals a, b in FIG. 11A become the levels (A), (A) respectively, and signal e in FIG. 11B becomes the negative level (A). In case (B), also the negative level (B) of e in FIG. 11B. In the cases of (A), (B), the semiconductor wafer 61 is moved in left side horizontally in X-direction by the X-Y stage 82 in accordance with the instruction e.

In case (C), both signal a and b in FIG. 11A are same level of (C), and therefore the signal (e) in FIG. 11B become 0 (zero). This means that the mask and the semiconductor wafer are correct alignment state, and in this case no movement of the X-Y stage is necessary.

In the vicinity of 0 (zero) in FIG. 11B, the sensitivity becomes high level such as 1.1 V/μm, that is, the curve e is sharp in the vicinity of 0 (zero), and therefore, according to the present invertion, precise alignment can be expected.

Cases (D) and (E) are opposite to the cases (B) and (A). That is, in cases (D) and (E) the positive levels of signal e in FIG. 11B are obtained, respectively, and the movement of the X-Y stage toward right direction is conducted.

Cases (A), (B), (D), (E) are of misalignment, and therefore the semiconductor wafer is moved in accordance with the negative or positive signal level e or g so that case (C) is obtained, that is, the movement is conducted till the signal e becomes 0 (zero).

The present invention is useful within the scope $\Delta D$ (between (B) and (D)), and therefore, a rough alignment is favorably conducted before operation of the present invention by the other means such as tool, zig etc. such that the curve e exists in $\Delta D$ at the start of the present invention.

The embodiment only described the movement of the semiconductor wafer. However, the mask may be moved in replace of the semiconductor wafer to obtain the correct alignment between the mask and the semiconductor wafer. In this case, the semiconductor is fixed on a fixed stage, and the mask is installed on the other X-Y stage.

Further, the alignment in X-direction has been only explained. However, the same manner is conducted in Y-direction.

The first embodiment occupies somewhat a large area because two LFZP's and two parallel reflecting gratings are used. However, the first embodiment can select freely the amount of $\Delta D$ and the w value of the reflecting diffraction grating.

SECOND EMBODIMENT

Referring to FIGS. 13 to 16, a first reflecting grating 101 and a second reflecting grating 102 each having the same width w are abutted against each other at the boundary 103. Each of the reflecting gratings 101, 102 consists of a plurality of concaves or convexs as these of the first embodiment. Therefore, the distance between centers of the first and second reflecting gratings 101, 102 becomes w. Therefore, only one LFZP 80 is used. When the center 105 of the slit-like incident beam 104 having also the width w coincides with the boundary 103. The signal e in FIG. 16B becomes 0 (zero).

Figure 17:
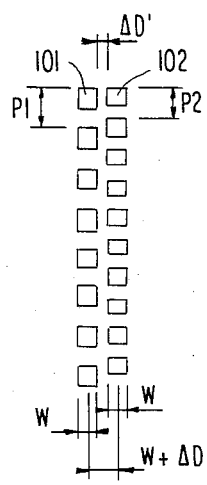
FIG. 17 is a plan view showing reflecting grating patterns of a version of the second embodiment.
Figure 18A:
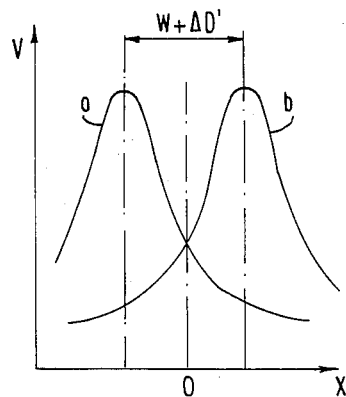
FIG. 18A is a diagram showing output signals of detectors in the version of the second embodiment.
Figure 18B:
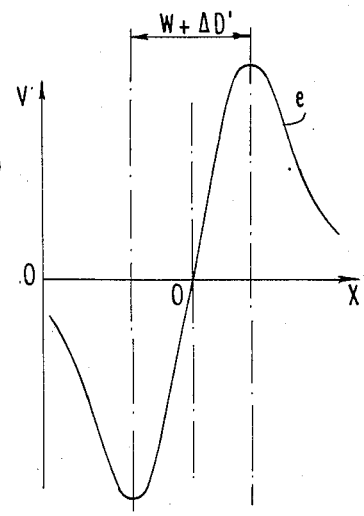
FIG. 18B is a diagram showing an output signal of a subtracter in the version of the second embodiment.
Figure 19:
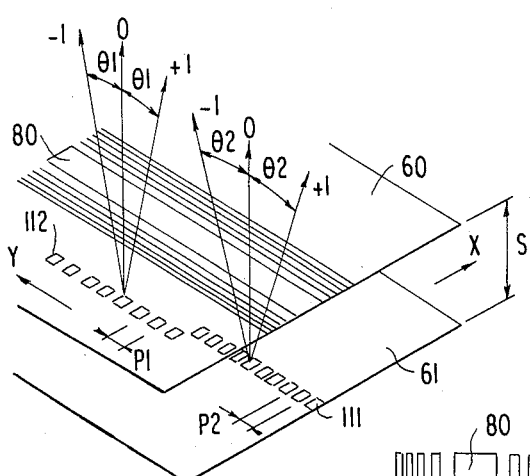
FIG. 19 is a perspective view showing a mask and a semiconductor wafer of a third embodiment of the present invention.
Figure 20:
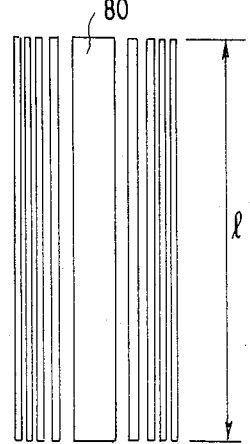
FIG. 20 is a plan view showing an LFZP of the third embodiment.
Figure 21:
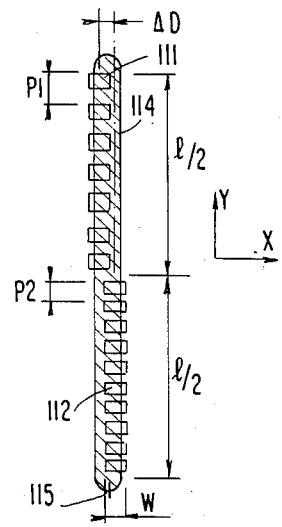
FIG. 21 is a plan view showing reflecting grating patterns of the third embodiment.

The first and second reflecting gratings 101, 102 of the second embodiment may be separated by a minor distance $\Delta D'$ as shown in FIGS. 17 and 18. In this case, the distance between the centers of the first and second reflecting gratings becomes $(w + \Delta D')$.

In FIGS. 13 to 18, the same components as those in FIGS. 6 to 12 are indicated by the same numerals.

The second embodiment occupies a small area in the mask and wafer for alignment. However, the width dimensions cannot be freely selected.

THIRD EMBODIMENT

Referring to FIGS. 19 to 22, first and second reflecting gratings 111, 112 are arranged in Y-direction such that the centers of these reflecting gratings is deviated by $\Delta D$. The first and second reflecting grating 111, 112 are composed of a plurality of concaves or convexs as these of the first embodiment. When the length l is 800 μm which is smaller than the laser beam diameter the length (l/2) of each reflecting gratings becomes 400 μm. When the center 115 of the slit-like beam coincides with $\Delta D/2$, the signal e in FIG. 22B becomes 0 (zero). The third embodiment necessitates only one LFZP 80, further the dimensions w and $\Delta D$ can be freely selected comparing with the second embodiment. However, the longer LFZP is necessary.

In FIGS. 19 to 22, the same components as those in FIG. 6 to 12 are indicated by the same numerals.

FOURTH EMBODIMENT

Referring to FIGS. 23 to 26, the same construction as the second embodiment is disclosed. However, the width w' of each of first and second reflecting diffraction gratings 122, 121 ranges favorably 10 μm to 30 μm which is far wider than that of the other embodiments. These reflecting gratings 122, 121 are constructed by a plurality of concaves or convexs as these of the first embodiment. When the center 125 of the beam 124 coincides with the foundary 123 between the first and second reflecting gratings, the signal e in FIG. 26B becomes 0 (zero). The embodiment also employs only one LFZP 80. In the embodiment, the width w' of the reflecting grating is 20 μm, for example. It is possible to effect automatic alignment by means of an alignment servo of the present invention if the pre-alignment accuracy is about 40 μm. The accuracy of the order can be realized simply by obtaining an adequate mechanical accuracy based on the orientation flat of the wafer. As the width w' of the reflecting diffraction gratings is increased, the misalignment detectable range is enlarged. However, since it is preferable to minimize the occupied area of the mark, it is appropriate to set the width w' at such a value that the sum of the areas of the first and second diffraction gratings 122, 123 is equal to the area of the LFZP 80 which has the width of 20 to 60 μm, for example.

In FIGS. 23 to 26, the same components as those in FIG. 6 to 12 are indicated by the same numerals.

What is claimed is:

1. A method of alignment between a mask and a semiconductor wafer comprising steps of setting said semiconductor wafer on a stage, said semiconductor wafer including a first reflecting grating including a plurality of concaves or convexs arranged in a first direction with a constant pitch and a second reflecting grating including a plurality of concaves or convexs arranged in said first direction with a constant pitch which is a different value from said pitch of said first reflecting grating, the center in a second direction perpendicular to said first direction in the wafer plane of said second reflecting grating being separated from the center in said second direction of said first reflecting grating by a first distance in said second direction;

superimposing said mask above said semiconductor wafer with a predetermined gap, said mask providing first and second linear Fresnel zone late lenses each including opaque and transparent stripes extending in said first direction and alternately arranged in said second direction, and the center line extending in said first direction of said first linear Fresnel zone plate lens being separated from the center line extending in said first direction of said second linear Fresnel zone plate lens by a second distance in said second direction, said second distance being smaller or larger than said first distance by a minute value; irradiating a monochromatic radiation on said first and second linear Fresnel zone plate lenses and focusing said radiation to form first and second slit-shape images of said radiation on said first and second reflecting gratings, respectively;

detecting a first reflected radiation from said first reflecting grating through said first linear Fresnel zone plate lens by a first detector;

detecting a second reflected radiation from said second reflecting grating through said second linear Fresnel zone plate lens by a second detector;

obtaining a difference value between the outputs of said first and second detectors; and displacing the relative position between said mask and said semiconductor wafer in said second direction in accordance with said difference value until said difference value becomes minimum in absolute.

2. A method of claim 1, in which said monochromatic radiation is a laser beam.

3. A method of claim 1, in which the difference between said first and second distance is substantially equal to the width in said second direction of said first and second reflecting gratings.

4. A method of claim 1, in which the difference between said first and second distance ranges from 0.5 $\mu$m to 3.0 $\mu$m.

5. A method of claim 1, in which the width of said slit-shape image is substantially equal to the width of said first and second reflecting gratings.

6. A method of alignment between a mask and a semiconductor wafer comprising steps of setting said semiconductor wafer on a stage, said semiconductor wafer including a first reflecting grating including a plurality of concaves or convexs arranged in a first direction with a constant pitch and a second reflecting grating including a plurality of concaves or convexs arranged in said first direction with a constant pitch which is a different value from said pitch of said first reflecting grating; superimposing said mask above said semiconductor wafer with a predetermined gap, said mask providing a linear Fresnel zone plate lens including opaque and transparent stripes extending in said first direction and alternately arranged in a second direction;

irradiating a laser beam on said linear Fresnel zone plate lens and focusing said laser beam to form a slit-like image of said laser beam on said first reflecting grating and/or on said second reflecting grating;

detecting a first reflected radiation from said first reflecting grating through said linear Fresnel zone plate lens by a first detector;

detecting a second reflected radiation from said second reflecting grating through said linear Fresnel zone plate lens by a second detector;

obtaining a difference value between the outputs of said first and second detectors; and displacing the relative position between said mask and said semiconductor wafer in said second direction in accordance with said difference value until said difference value becomes minimum in absolute.

7. A method of claim 6, in which said first and second reflecting gratings are abutted against each other in sid second direction at the boundary line therebetween.

8. A method of claim 7, in which each of said first and second reflecting gratings has the width in said second direction which is substantially equal to the width of said slit-like image of said laser beam in said second direction.

9. A method of claim 7, in which each of said first and second reflecting gratings has the width in said second direction ranging from 10 $\mu$m to 30 $\mu$m.

10. A method of claim 6, in which said first and second reflecting gratings are arranged in said first direction, and the center lines extending in said first direction of said first and second reflecting gratings deviate in said second direction, each other.

11. A method of claim 6, in which the width in said second direction of said slit-like image of said laser beam ranges from 0.5 $\mu$m to 3.0 $\mu$m.

* * * * *

UNITED STATES PATENT AND TRADEMARK OFFICE
CERTIFICATE OF CORRECTION

PATENT NO.　:　4,815,854
DATED　　　:　March 28, 1989
INVENTOR(S):　Yoshiharu Tanaka et al.

It is certified that error appears in the above-identified patent and that said Letters Patent is hereby corrected as shown below:

Col. 2, line 53, delete "directin" and insert --direction--.
Col. 2, line 61, delete "firsst" and insert --first--.

Col. 4, line 27, delete "um" and insert --$\mu$m--.
Col. 4, line 42, delete "reflceting" and insert --reflecting--.
Col. 4, line 47, delete "0" and insert --$\theta$--.
Col. 5, line 11, delete "X-directin-- and insert --X-direction--.
Col. 6, line 27, delete " mojor" and insert --major--.
Col. 7, line 16, delete "(dirction" and insert --(direction--.
Col. 7, line 65, delete "Y-direection" and insert --Y-direction--.

UNITED STATES PATENT AND TRADEMARK OFFICE
CERTIFICATE OF CORRECTION

PATENT NO. : 4,815,854
DATED : March 28, 1989
INVENTOR(S) : Yoshiharu Tanaka et al.

It is certified that error appears in the above-identified patent and that said Letters Patent is hereby corrected as shown below:

Col. 8, line 39, delete "$\Lambda_1$" and insert -- $\theta_1$ --.
Col. 8, line 44, delete "($\theta_1 \theta hd2$)" and insert --($\theta_1, \theta_2$)--.
Col. 8, line 46, delete "(n$\lambda$p)" and insert --(n$\lambda$/p)--.
Col. 12, line 37, delete "sid" and insert --said--.

Signed and Sealed this

Ninth Day of January, 1990

Attest:

JEFFREY M. SAMUELS

Attesting Officer     Acting Commissioner of Patents and Trademarks